(12) United States Patent
Jang et al.

(10) Patent No.: US 8,698,154 B2
(45) Date of Patent: Apr. 15, 2014

(54) ARRAY SUBSTRATE FOR FRINGE FIELD SWITCHING MODE LIQUID CRYSTAL DISPLAY DEVICE

(71) Applicant: LG Display Co., Ltd., Seoul (KR)

(72) Inventors: Hun Jang, Paju-si (KR); Sul Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/723,867

(22) Filed: Dec. 21, 2012

(65) Prior Publication Data

US 2013/0256669 A1 Oct. 3, 2013

(30) Foreign Application Priority Data

Mar. 29, 2012 (KR) .......................... 10-2012-0032204

(51) Int. Cl.
*H01L 29/04* (2006.01)
*H01L 27/12* (2006.01)
*G02F 1/1362* (2006.01)

(52) U.S. Cl.
CPC .......... *H01L 27/124* (2013.01); *H01L 27/1214* (2013.01); *G02F 1/136286* (2013.01)
USPC .......................... 257/59; 257/72; 257/E27.121

(58) Field of Classification Search
CPC .............. H01L 27/124; H01L 27/1214; G02F 1/136286
USPC ........................ 257/59, 72, E27.121
See application file for complete search history.

(56) References Cited

U.S. PATENT DOCUMENTS 7,532,294 B2 * 5/2009 Kim et al. ..................... 349/141

* cited by examiner

*Primary Examiner* — Tu-Tu Ho
(74) *Attorney, Agent, or Firm* — Fenwick & West LLP

(57) ABSTRACT

An array substrate for a fringe field switching mode LCD device includes a pixel electrode having a plate shape in a pixel region; and a common electrode including a plurality of bar-type openings that correspond to the pixel electrode and long axes of which are inclined at a first angle in a clockwise direction or counterclockwise direction with respect to a normal line perpendicular to the gate line, wherein a data line is formed in a zigzag shape, wherein two adjacent data lines among three adjacent data lines are disposed in parallel with each other and the other data line is linearly symmetrical with respect to the two adjacent data lines, and wherein the long axis of each of the plurality of bar-type openings is disposed in parallel with one of data lines that define the pixel region and are located at both sides of the pixel region.

9 Claims, 4 Drawing Sheets

ARRAY SUBSTRATE FOR FRINGE FIELD SWITCHING MODE LIQUID CRYSTAL DISPLAY DEVICE

CROSS-REFERENCE TO RELATED APPLICATION

The present application claims the priority benefit of Korean Patent Application No. 10-2012-0032204 filed in Republic of Korea on Mar. 29, 2012, which is hereby incorporated by reference in its entirety.

BACKGROUND

1. Field of the Disclosure

The present disclosure relates to a liquid crystal display (LCD) device, and more particularly, to an array substrate for a fringe field switching mode LCD device in which multiple domains are formed without lowering transmissivity to prevent occurrence of a color shift phenomenon, thereby improving display quality.

2. Discussion of the Related Art

In general, a liquid crystal display (LCD) device is driven using optical anisotropic and polarization properties of liquid crystal. The liquid crystal has a slender and long structure and thus has directionality in a molecular arrangement thereof. A direction of the molecular arrangement may be controlled by artificially applying an electric field to the liquid crystal.

When the direction of the molecular arrangement of the liquid crystal is arbitrarily controlled, the molecular arrangement of the liquid crystal changes and light is refracted in the direction of the molecular arrangement of the liquid crystal due to the optical anisotropic properties of the liquid crystal, thereby displaying image information.

Recently, much attention has been paid to an active matrix LCD (AM-LCD) in which a thin film transistor (TFT) and a pixel electrode connected to the TFT are arranged in a matrix (hereinafter abbreviated as 'LCD'), since the AM-LCD has high resolution and capability of displaying moving pictures.

An LCD includes a color filter substrate on which a common electrode is formed, an array substrate on which a pixel electrode is formed, and liquid crystal between the two substrates. The LCD has high transmissivity and aperture ratio, since the liquid crystal is driven using an electric field that is vertically applied to the common electrode and the pixel electrode.

However, when the liquid crystal is driven using the vertically applied electric field, viewing angle characteristics are not high.

To solve this problem, a fringe field switching mode LCD device having improved viewing angle characteristics has been introduced.

FIG. 1 is a plan view of one pixel region of an array substrate 41 for the related art fringe field switching mode LCD device.

Referring to FIG. 1, a plurality of gate lines 43 each having a straight-line shape extend in one direction, and a plurality of data lines 51 each having a straight-line shape cross the plurality of gate lines 43 to define a plurality of pixel regions P.

Each of the plurality of pixel regions P is connected to one of the plurality of data lines 51 and one of the plurality of gate lines 43, which define the pixel region P, and includes a TFT Tr which is a switching device including a gate electrode 45, a gate insulating film (not shown), a semiconductor layer (not shown), and source and drain electrodes 55 and 58.

Also, in each of the pixel regions P, a pixel electrode 60 that has a plate shape and that is electrically connected to the drain electrode 58 of the TFT Tr is formed.

Also, in an entire display region including the plurality of pixel regions P, a common electrodes 75 is formed to correspond to each of the plurality of pixel regions P, overlap with the pixel electrode 60 having the plate shape, and include a plurality of bar-type openings op that are formed in the corresponding pixel region P and long axes of which are arranged in a direction in which the plurality of data lines 51 are arranged. Although the common electrode 75 is formed in the entire display region, a portion of the common electrode 75 corresponding to one of the plurality of pixel regions P is denoted by a dotted line.

In the array substrate 41 for the related art fringe field switching mode LCD device having the structure described above, a fringe field is formed by applying voltage to the common electrode 75 having the plurality of bar-type openings op and the pixel electrode 60 in units of the plurality of pixel regions P.

However, since in a fringe field switching mode LCD device having the array substrate 41 described above, a single domain is formed in an entire display region, a color shift phenomenon occurs when an image is viewed in an upper right direction, an upper left direction, a lower right direction, and a lower left direction. That is, yellow is strongly presented when an image is viewed in the upper left direction, and blue is strongly presented when the image is viewed in a vertical direction, thereby degrading display quality.

SUMMARY OF THE INVENTION

Accordingly, the present invention is directed to an array substrate for a fringe field switching mode liquid crystal display (LCD) capable of suppressing the color shift phenomenon, thereby improving display quality.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate for a fringe field switching mode liquid crystal display device includes gate lines and data lines crossing each other to define a plurality of pixel regions in a display region; a thin film transistor (TFT) electrically connected to the gate line and the data line; a pixel electrode having a plate shape in the pixel region, and connected to a drain electrode of the TFT; a first protective layer on the pixel electrode to cover the TFT, the gate lines, and the data lines; and a common electrode on the first protective layer, and including a plurality of bar-type openings that correspond to the pixel electrode and long axes of which are inclined at a first angle in a clockwise direction or counter-clockwise direction with respect to a normal line perpendicular to the gate line, wherein the data lines are each formed in a zigzag shape in the display region, wherein two adjacent data lines among three adjacent data lines are disposed in parallel with each other and the other data line is linearly symmetrical with respect to the two adjacent data lines, and wherein the long axis of each of the plurality of bar-type openings is disposed in parallel with one of data lines that define each of the plurality of pixel regions and are located at both sides of each of the plurality of pixel regions.

In another aspect, an array substrate for a fringe field switching mode liquid crystal display device includes gate lines and data lines crossing each other to define a plurality of pixel regions in a display region; a thin film transistor (TFT) electrically connected to the gate line and the data line; a first protective layer on the TFT and in the entire display region; a common electrode having a plate shape on the first protective layer and in the entire display region, the common electrode removed on the TFT; a second protective layer on the common electrode and in the entire display region; and a pixel electrode on the second protective layer and connected to a drain electrode of the TFT, and including a plurality of bar-type openings that correspond to the pixel region and long axes of which are inclined at a first angle in a clockwise direction or a counterclockwise direction with respect to a normal line perpendicular to the gate line, wherein the data lines are each formed in a zigzag shape in the display region, wherein two adjacent data lines among three adjacent data lines are disposed in parallel with each other, and the other data line is linearly symmetrically with respect to the two adjacent data lines, and wherein the long axis of each of the plurality of bar-type openings is disposed in parallel with one of data lines that define each of the plurality of pixel regions and are located at both sides of each of the plurality of pixel regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to exemplary embodiments, examples of which are illustrated in the accompanying drawings.

Figure 2:
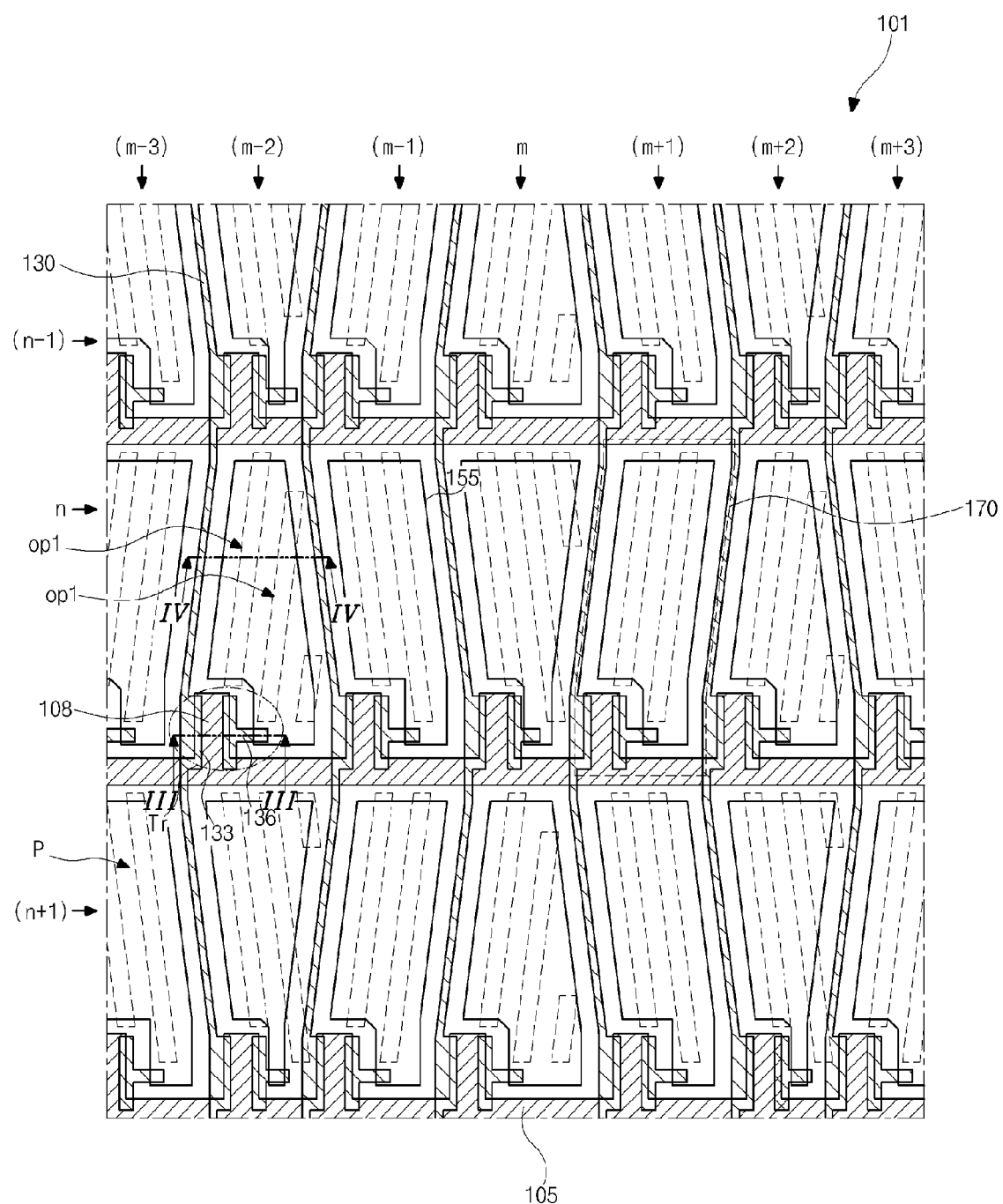
FIG. 2 is a planar view of a portion of a display region of an array substrate for a fringe field switching mode LCD device according to an embodiment of the present invention.

FIG. 2 is a planar view of a portion of a display region of an array substrate 101 for a fringe field switching mode liquid crystal display (LCD) device according to an embodiment of the present invention. For convenience of explanation, in FIG. 2, pixel regions P connected to the respective same gate lines 105 in a horizontal direction are grouped into an $(n-1)^{th}$ row, an $n^{th}$ row, and an $(n+1)^{th}$ row in a downward direction, and pixel regions P connected to the respective same data lines 130 in a vertical direction are grouped into an $(m-3)^{th}$ column, an $(m-2)^{th}$ column, an $(m-1)^{th}$ column, an $m^{th}$ column, an $(m+1)^{th}$ column, an $(m+2)^{th}$ column, and an $(m+3)^{th}$ column from a left direction to a right direction. A portion of each of the pixel regions P in which a thin film transistor (TFT) Tr which is a switching device is formed is defined as a switching region.

As illustrated in FIG. 2, in the array substrate 101 for a fringe field switching LCD device according to the present embodiment, a plurality of gate lines 105 extending in the horizontal direction (hereinafter referred to as a 'first direction') are disposed apart from one another at predetermined intervals, in units of the pixel regions P, and a plurality of data lines 130 extending in the vertical direction (hereinafter referred to as a 'second direction') cross the plurality of gate lines 105 to define the plurality of pixel regions P. Each of the plurality of gate lines 105 has a straight-line shape. Each of the plurality of data lines 130 has a bent portion with respect to one of the plurality of gate lines 105 such that the plurality of data lines 130 are each formed in a zigzag shape in the entire display region.

According to an embodiment of the present invention, since the plurality of data lines 130 are each formed in the zigzag shape, each of the pixel regions P defined as regions surrounded by the plurality of gate lines 105 and the plurality of data lines 130 that cross one another does not have a rectangular shape but has a trapezoidal shape or a parallelogram shape.

Specifically, the plurality of data lines 130 do not all have the same zigzag shape, but with respect to the $(n-1)^{th}$ row, the data line 130 in the $(m-3)^{th}$ column is inclined from an upper left direction to a lower right direction to form a zigzag shape, the data line 130 in the $(m-2)^{th}$ column adjacent to the $(m-3)^{th}$ column is inclined from an upper right direction to a lower left direction to form a zigzag shape, and the data line 130 in the $(m-1)^{th}$ column forms a zigzag shape in parallel with the data line 130 in the $(m-2)^{th}$ row.

Accordingly, in the array substrate 101 for a fringe field switching mode LCD device according to the present embodiment, data lines 130 at both sides among three adjacent data lines 130 form opposite zigzag shapes, and the remaining middle data line 130 forms a zigzag shape in parallel with the data line 130 at a left or right side thereof.

Thus, in the array substrate 101 for a fringe field switching mode LCD device according to the present embodiment, each of the pixel regions P defined with the data lines 130 and the gate lines 105 that cross one another has a parallelogram shape inclined to the left, a parallelogram shape inclined to the right, a normal trapezoidal shape, the upper side of which is short and the lower side of which is long, or a reversed trapezoidal shape, the upper side of which is long and the lower side of which is short, according to the shapes and arrangement of data lines 130.

In each of the pixel regions P, the TFT Tr is connected to one of the gate lines 105 and one of the data lines 130, and includes a gate electrode 108, a gate insulating film (not shown), a semiconductor layer (not shown), and source and drain electrodes 133 and 136 that are spaced apart from each other.

Also, in each of the pixel regions P, a pixel electrode 155 having a plate shape is formed to contact the drain electrode 136 of the TFT Tr. The pixel electrode 155 having the plate shape is formed according to the shape of the corresponding pixel region P among the pixel regions P.

In the case of the array substrate 101 for a fringe field switching mode LCD device according to the present embodiment, since each of the pixel regions P has a parallelogram shape inclined to the left or right, a normal trapezoidal shape, or a reversed trapezoidal shape, the pixel electrode 155 has a parallelogram shape inclined to the left or right, a normal trapezoid shape, or a reversed trapezoidal shape according to the shape of the corresponding pixel region P.

Also, in the entire display region 200 including the pixel regions P, a common electrode 170 having a plurality of bar-type openings op1 are formed to correspond to the pixel electrode 155 having the plate shape formed in each of the pixel regions P. For convenience of explanation, although not shown, since the common electrode 170 is formed in the entire display region, a portion of the common electrode 170 formed in one pixel region P is denoted by a dotted line and is assigned reference numeral 170.

Also, in the array substrate 101 for a fringe field switching mode LCD device according to the present embodiment, long axes of the plurality of bar-type openings op1 corresponding to the pixel electrode 155 having the plate shape in each of the pixel regions P are arranged in parallel with a data line 130 among the data lines 130 located at the left and right sides of the pixel region P to define the pixel region P, at a predetermined angle with respect to a virtual reference line perpendicular to the gate lines 105. The predetermined angle may range from 3 to 15 degrees in a clockwise/counterclockwise direction with respect to the virtual reference line.

Accordingly, the plurality of bar-type openings op1 in each of the pixel regions P each having the parallelogram shape are disposed in parallel with the data lines 130 that are disposed at the left and right sides of the pixel region P to define the pixel region P, since these data lines 130 are all inclined in the same direction. The plurality of bar-type openings op1 in each of the pixel regions P each having a normal or reversed trapezoidal shape are disposed in parallel with the data line 130 disposed at the left or right side of the pixel region P.

In the array substrate 101 having the plurality of bar-type openings op1 for a fringe field switching mode LCD device according to the current embodiment, the long axes of the bar-type openings op1 in each of the pixel regions P are arranged in one direction. However, in the entire display region, the bar-type openings op1 are arranged in at least two directions between three pixel regions P adjacent in the first direction, thereby forming multiple domains.

Figure 1:
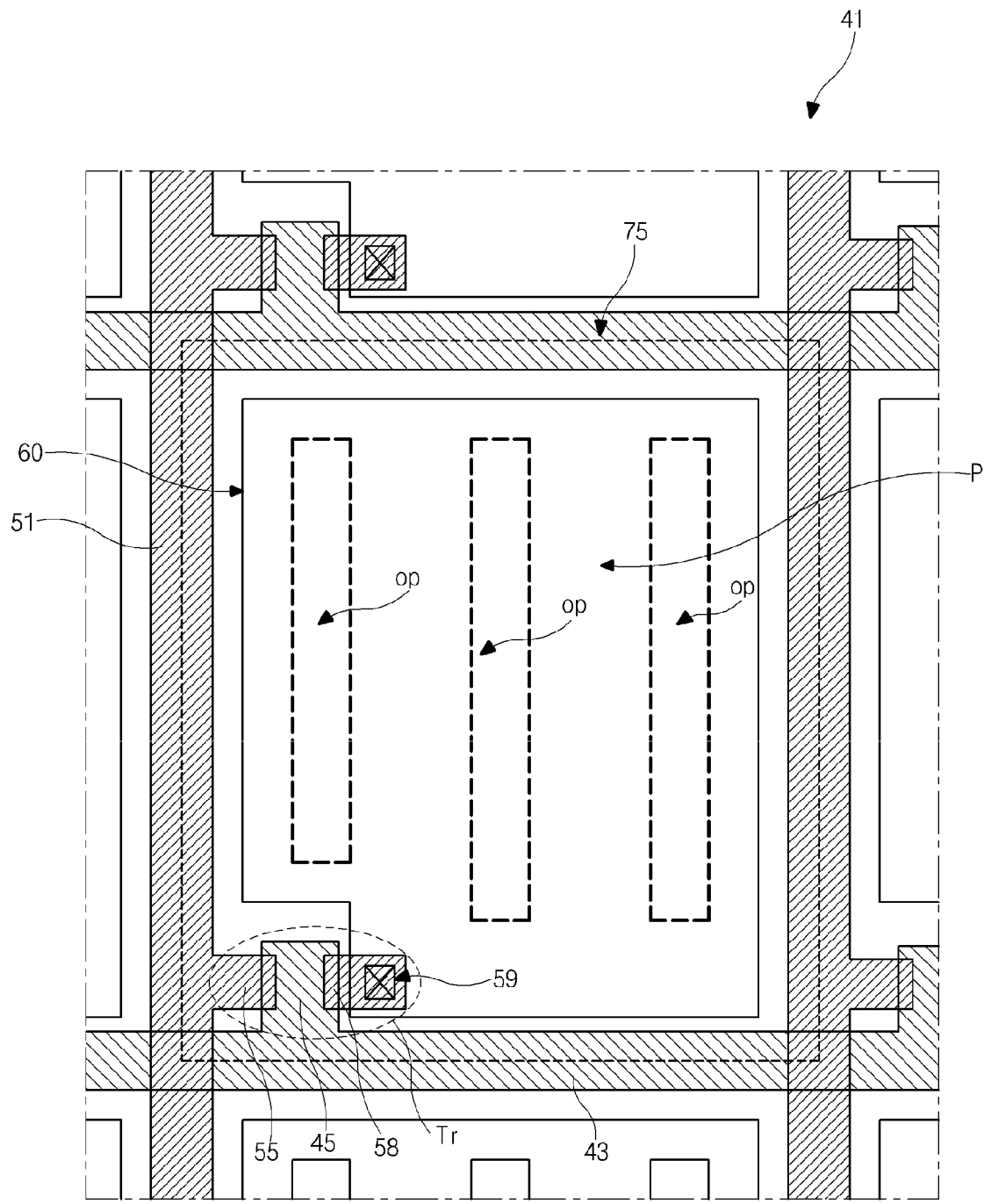
FIG. 1 is a planar view of one pixel region of an array substrate for the related art fringe field switching mode liquid crystal display (LCD) device.

Thus, it is possible to suppress the color shift phenomenon that may occur in the array substrate 41 for the related art fringe field switching mode LCD device illustrated in FIG. 1 in which all of the bar-type openings op in the respective pixel regions P are arranged in one direction to form a single domain in the entire display region.

Although not shown, in an array substrate for a fringe field switching mode LCD device according to a first comparative example of the present invention, multiple domains may be formed in even one pixel region by forming bar-type openings to be bent to be symmetrical with respect to central portions thereof in a direction of long axes thereof.

However, when bar-type openings each having a bent portion are formed in one pixel region, liquid crystal molecules do not work normally at the bent portions of these openings in the pixel region, thereby causing disclination to occur.

Thus, since black matrices are formed at the bent portions of the openings, optical transmissive regions are reduced in size, thus lowering transmissivity. Thus, for example, luminance characteristics of backlight should be improved to realize transmissivity according to voltage applied, thereby increasing power consumption of backlight. When the array substrate for a fringe field switching mode LCD device according to the first comparative example is applied to a personal mobile device, power consumption of a battery increases.

However, in the case of an array substrate for a fringe field switching mode LCD device according to an embodiment of the present invention, the bar-type openings op1 in each of pixel regions P do not have a bent region, and instead, the bar-type openings op1 in adjacent pixels region P are formed in different directions to form multiple domains in the entire display region, thereby suppressing the color shift phenomenon without lowering transmissivity.

Although not shown, in an array substrate for a fringe field switching mode LCD device according to a second comparative example of the present invention, data lines each have a bent portion with respect to one of gate lines, and multiple domains are formed in an entire display region even when adjacent data lines are arranged in parallel with one another. Since, the gate lines each have a bent portion, the color shift phenomenon may be suppressed without lowering transmissivity.

However, in the case of the array substrate for a fringe field switching mode LCD device according to the second comparative example in which all of the data lines are formed in the same zigzag shape to be parallel with one another in the entire display region, bar-type openings in pixels in a row connected to the same gate line are all arranged in the same direction.

When manufacture of an array substrate is completed, an array completion test is performed thereon. In the array completion test, whether pixel regions are defective is checked while gate lines in odd-numbered rows are 'on,' and whether the pixel regions are defective is checked while gate lines in even-numbered rows are 'on.'

In this case, in the array substrate for a fringe field switching mode LCD device according to the second comparative example, bar-type openings in all of pixel regions connected to gate lines in odd-numbered rows are arranged in the same direction. Similarly, bar-type openings in all of pixel regions connected to gate lines in even-numbered rows are arranged in the same direction. Thus, if only the gate lines in the odd-numbered rows or the even-numbered rows are 'on,' a single domain is formed in the entire display region rather than multiple domains, thereby causing the color shift phenomenon to occur.

In contrast, in the array substrate 101 for a fringe field switching mode LCD device according to an embodiment of the present invention, the data lines 130 are not all arranged in parallel with one another in the display region; and two adjacent data lines 130 among three adjacent data lines 130 are bent in a direction different than a direction in which the other data line 130 is bent and the bar-type openings are arranged in parallel with the data lines 130. Thus, even if only odd-numbered gate lines or even-numbered gate lines are 'on,' multiple domains are formed in the entire display region, thereby suppressing the color shift phenomenon.

Although not shown, in the array substrate 101 for a fringe field switching mode LCD according to an embodiment of the present invention, the common electrode 170 may include not only the bar-type openings op1 but also a second opening (not shown) in the TFT Tr included in the switching region.

The second opening is formed to prevent degradation in the performance of the TFT Tr caused when the common electrode 170 and the TFT Tr which is a switching device overlap with each other to generate a parasitic capacitance.

A cross-sectional structure of an array structure of a fringe field switching mode LCD device according to an embodiment of the present invention will now be described.

Figure 3:
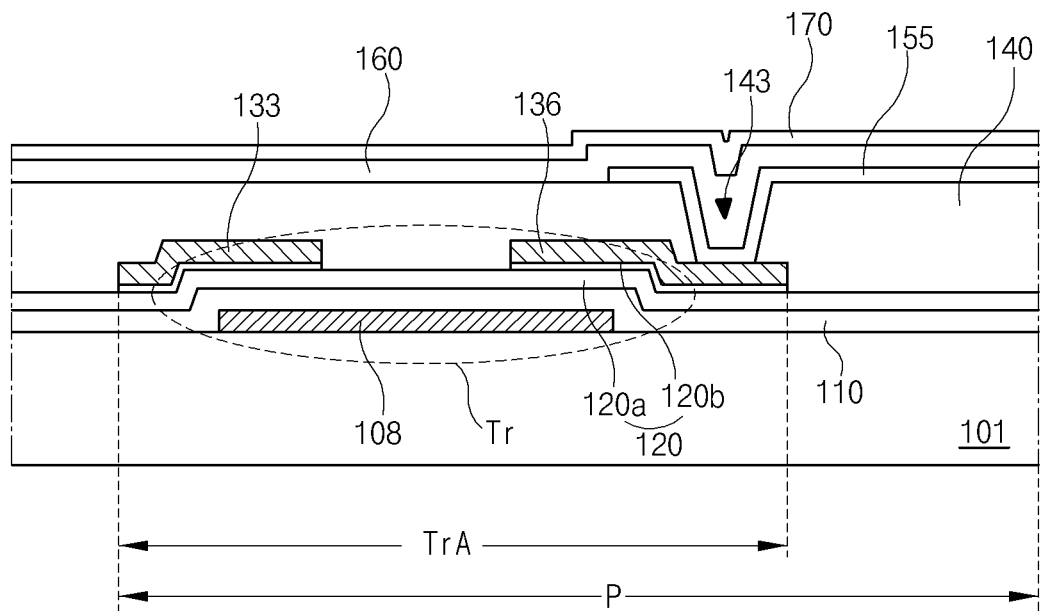
FIG. 3 is a cross-sectional view taken along line III-III of FIG. 2.
Figure 4:
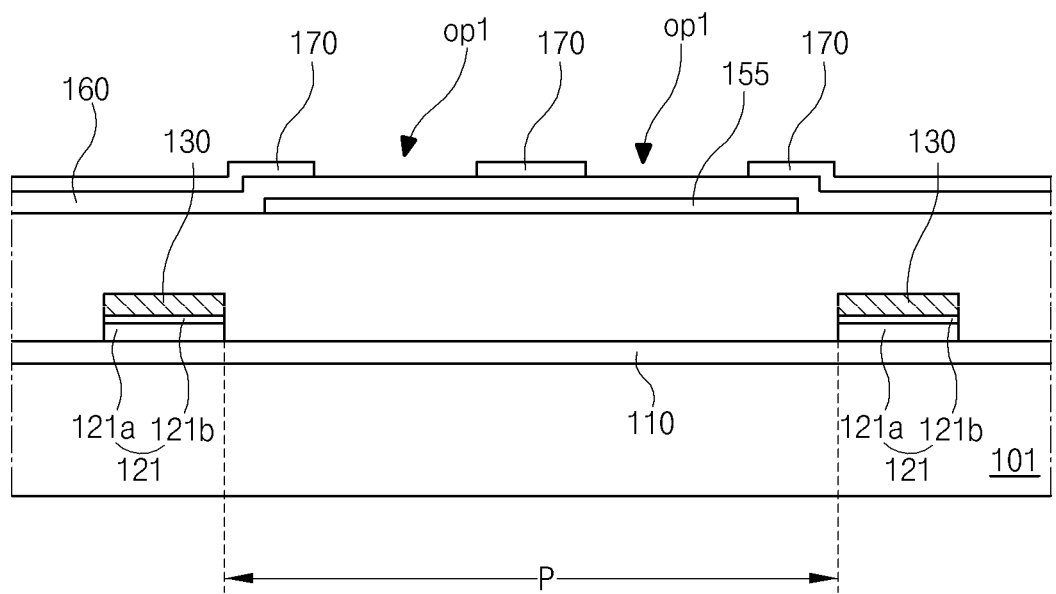
FIG. 4 is a cross-sectional view taken along line IV-IV of FIG. 2.

FIG. 3 is a cross-sectional view taken along line III-III of FIG. 2. FIG. 4 is a cross-sectional view taken along line IV-IV of FIG. 2.

Referring to FIGS. 3 and 4, on a transparent insulating substrate 101, the gate line (105 of FIG. 2) having a straight-line shape and extending in the first direction is formed of a metal material having low resistance properties, e.g., a metal material selected from the group consisting of aluminum (Al), an aluminum alloy (AlNd), copper (Cu), a copper alloy, chromium (Cr), and molybdenum (Mo), and a gate electrode 108 is formed in a switching region TrA to be connected to the gate line 105.

A gate insulating film 110 is formed on the entire substrate 101 using an inorganic insulating material, e.g., silicon oxide ($SiO_2$) or a silicon nitride ($SiN_x$), to be on the gate line 105 and the gate electrode 108.

Then, a semiconductor layer 120 including an active layer 120a formed of pure amorphous silicon and an ohmic contact layer 120b formed of amorphous silicon doped with impurities is formed on the gate insulating film 110 to correspond to the gate electrode 108 in the switching region TrA. Source and drain electrodes 133 and 136 are formed on the semiconductor layer 120 to be spaced apart from each other. In this case, the active layer 120b is exposed between the source and drain electrodes 133 and 136 that are spaced apart from each other.

Referring to FIG. 4, a data line 130 that crosses the gate line 105 to form a pixel region P is formed on the gate insulating film 110 to extend in the second direction, and is formed in a zigzag shape with respect to the gate line 105 in a display region. A planar shape of the data line 130 has been described above in detail with reference to the plan view illustrated in FIG. 2 and is thus not described again here.

Although the semiconductor layer 120 is illustrated as including the active layer 120a formed of pure amorphous silicon and the ohmic contact layer 120b formed of amorphous silicon doped with impurities, the semiconductor layer 120 may include only the active layer 120b without the ohmic contact layer 120a when the semiconductor layer 120 is formed of an oxide semiconductor material.

A source electrode 133 of a TFT Tr formed in the switching area TrA is connected to the data line 130.

A semiconductor pattern 121 including two layers 121a and 121b is formed between the data line 130 and the gate insulating film 110 using a material used to form the semiconductor layer 120. Alternatively, the semiconductor pattern 121 may be formed below the data line 130 or may be omitted, according to a manufacturing method.

In other words, the semiconductor pattern 121 having the two layers 121a and 121b is formed below the data line 130 as illustrated in FIG. 4 when the semiconductor layer 120, the data line 130, and the source and drain electrodes 133 and 136 are simultaneously formed by performing a masking process once, and the semiconductor pattern 121 is not formed below the data line 130 when the semiconductor layer 120, the data line 130, and the source and drain electrodes 133 and 136 are separately formed by performing different masking processes, i.e., performing a masking process twice.

Also, a first protective layer 140 is formed of an inorganic insulating material, e.g., a silicon oxide ($SiO_2$) or a silicon nitride ($SiN_x$), or an organic insulating material, e.g., photo-acryl, to cover the data line 130 and the TFT Tr. When the first protective layer 140 is formed of the organic insulating material, an auxiliary protective layer (not shown) formed of an inorganic insulating material may be selectively disposed below the first protective layer 140.

FIG. 4 illustrates that the first protective layer 140 formed of an organic insulating material has a planarized surface and the auxiliary protective layer is not formed. In this case, the first protective layer 140 includes a drain contact hole 143 via which a portion of the drain electrode 136 of the TFT Tr is exposed. A pixel electrode 155 having a plate shape and formed of a transparent conductive material, e.g., an indium-tin-oxide (ITO) or an indium-zinc-oxide (IZO), is disposed on the first protective layer 140 including the drain contact hole 143 in units of pixel regions P to contact the drain electrode 136 via the drain contact hole 143.

Figure 5:
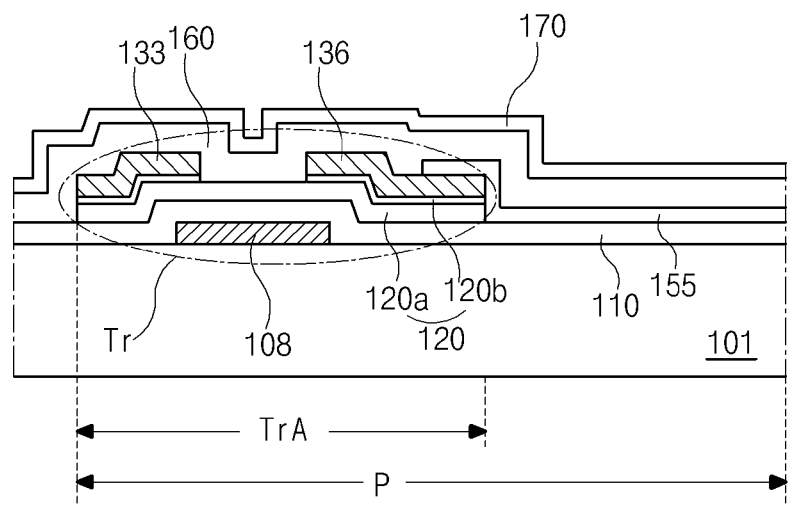
FIG. 5 is a cross-sectional view of an array substrate for a fringe field switching mode LCD device according to a modified example of the present invention, taken along line III-III of FIG. 2.
Figure 6:
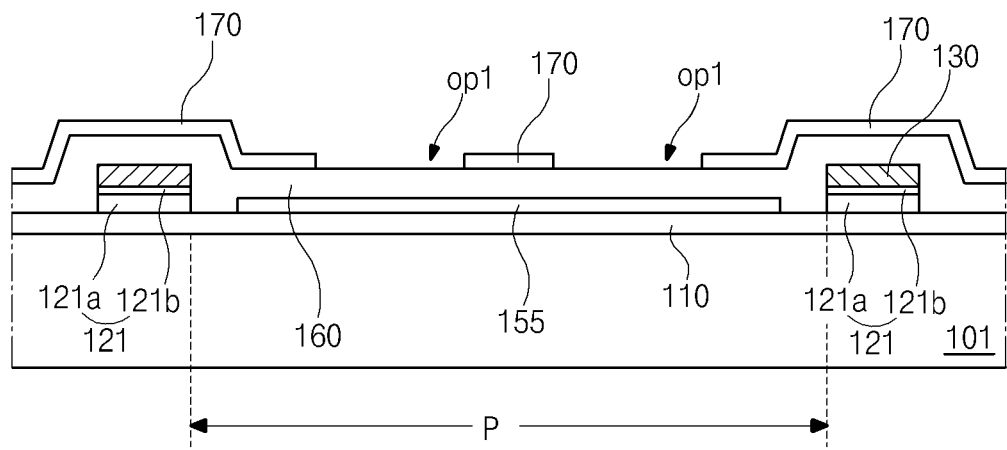
FIG. 6 is a cross-sectional view of an array substrate for a fringe field switching mode LCD device according to another modified example of the present invention, taken along line IV-IV of FIG. 2.

FIG. 5 is a cross-sectional view of an array substrate for a fringe field switching mode LCD device according to a modified example of the present invention, taken along line III-III of FIG. 2. FIG. 6 is a cross-sectional view of the array substrate for a fringe field switching mode LCD device according to another modified example of the present invention, taken along line IV-IV of FIG. 2. In FIGS. 2, 5 and 6, the same elements are denoted by the same reference numerals. Referring to FIGS. 5 and 6, a pixel electrode 155 directly contacts one end of a drain electrode 136 of a TFT Tr, and may be formed on a gate insulating film 110.

Although the pixel electrode 155 is illustrated as overlapping an upper portion of one end of the drain electrode 136, the pixel electrode 155 may be formed on the gate insulating film 110 and source and drain electrodes 133 and 136 may then be formed such that the drain electrode 136 overlaps an upper portion of one end of the pixel electrode 155.

Referring to FIGS. 5 and 6, a second protective layer 160 formed of an inorganic insulating material is disposed on the entire substrate 101 to be on the pixel electrode 155. A common electrode 170 having a plate shape and formed of the transparent conductive material described above is formed in an entire display region including pixel regions P to be on the second protective layer 160. In the common electrode 170, a plurality of bar-type openings op1 are formed in units of the pixel regions P. An arrangement of the plurality of bar-type openings op1 formed in the common electrode 170 to correspond to each of the pixel regions P has been described above with reference to the plan view illustrated in FIG. 4 and is not described again here.

The common electrode 170 may include not only the plurality of bar-type openings op1 but also a second opening (not shown) formed in the TFT Tr included in a switching region TrA of each of the pixel regions P not to overlap the plurality of bar-type openings op1.

According to the present embodiment, the plurality of bar-type openings opt in each of the pixel regions P are formed in the common electrode 170, but although not shown, the plurality of openings op1 may be formed in the pixel electrode 155 according to another modified example of the present invention.

In this case, the locations of the pixel electrode 155 and the common electrode 170 may be switched with each other, the pixel electrode 155 may thus be an uppermost layer, and the common electrode 170 is disposed below the pixel electrode 155 having the second protective layer 160 therebetween. The pixel electrode 155 contacts the drain electrode 136 of the TFT Tr via the drain contact hole 134. In this case, the second opening is formed in the common electrode 170 to correspond to the drain contact hole 134 and to be larger than the drain contact hole 134, thereby preventing a short circuit from occurring between the common electrode 170 and the pixel electrode 155.

In an array substrate for a fringe field switching mode LCD device according to an embodiment of the present invention, a plurality of bar-type openings are formed in each of pixel regions in a direction that is different from a direction in which a plurality of bar-type openings are formed in a neighboring pixel region, thereby forming multiple domains. Accordingly, the color shift phenomenon that causes a color variation according to a location at which an image is viewed may be prevented to improve display quality.

Also, since pixel regions located at upper and lower sides of each of gate lines are arranged in symmetrical directions, an aperture ratio and transmissivity may be improved.

Furthermore, since three pixel regions adjacent in a direction in which gate lines extend form multiple domains, during a completion test performed on an LCD device, the color shift phenomenon may be suppressed even if an image is displayed by applying different voltages to odd-numbered gate lines and even-numbered gate lines.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. An array substrate for a fringe field switching mode liquid crystal display device, comprising:
    gate lines and data lines crossing each other to define a plurality of pixel regions in a display region;
    a thin film transistor (TFT) electrically connected to the gate line and the data line;
    a pixel electrode having a plate shape in the pixel region, and connected to a drain electrode of the TFT;
    a first protective layer on the pixel electrode to cover the TFT, the gate lines, and the data lines; and
    a common electrode on the first protective layer, and including a plurality of bar-type openings that correspond to the pixel electrode and long axes of which are inclined at a first angle in a clockwise direction or counterclockwise direction with respect to a normal line perpendicular to the gate line,
    wherein the data lines are each formed in a zigzag shape in the display region,
    wherein two adjacent data lines among three adjacent data lines are disposed in parallel with each other and the other data line is linearly symmetrical with respect to the two adjacent data lines, and
    wherein the long axis of each of the plurality of bar-type openings is disposed in parallel with one of data lines that define each of the plurality of pixel regions and are located at both sides of each of the plurality of pixel regions.

2. The array substrate of claim 1, wherein each of the plurality of pixel regions has a parallelogram shape, a normal trapezoidal shape, or a reversed trapezoidal shape.

3. The array substrate of claim 2, wherein the pixel electrode has the same shape as the corresponding pixel region.

4. The array substrate of claim 1, wherein the first angle ranges from 3 to 15 degrees.

5. The array substrate of claim 1, wherein the long axes of the plurality of bar-type openings in pixel regions connected to the same gate line are arranged in two different directions.

6. An array substrate for a fringe field switching mode liquid crystal display device, comprising:
    gate lines and data lines crossing each other to define a plurality of pixel regions in a display region;
    a thin film transistor (TFT) electrically connected to the gate line and the data line;
    a first protective layer on the TFT and in the entire display region;
    a common electrode having a plate shape on the first protective layer and in the entire display region, the common electrode removed on the TFT;
    a second protective layer on the common electrode and in the entire display region; and
    a pixel electrode on the second protective layer and connected to a drain electrode of the TFT, and including a plurality of bar-type openings that correspond to the pixel region and long axes of which are inclined at a first angle in a clockwise direction or a counterclockwise direction with respect to a normal line perpendicular to the gate line,
    wherein the data lines are each formed in a zigzag shape in the display region,
    wherein two adjacent data lines among three adjacent data lines are disposed in parallel with each other, and the other data line is linearly symmetrically with respect to the two adjacent data lines, and
    wherein the long axis of each of the plurality of bar-type openings is disposed in parallel with one of data lines that define each of the plurality of pixel regions and are located at both sides of each of the plurality of pixel regions.

7. The array substrate of claim 6, wherein each of the plurality of pixel regions has a parallelogram shape, a normal trapezoidal shape, or a reversed trapezoidal shape.

8. The array substrate of claim 6, wherein the first angle ranges from 3 to 15 degrees.

9. The array substrate of claim 6, wherein the long axes of the plurality of bar-type openings in pixel regions connected to the same gate line are arranged in two different directions.

* * * * *